United States Patent
Gessford et al.

(12)

(10) Patent No.: US 6,603,297 B1
(45) Date of Patent: *Aug. 5, 2003

(54) PROBE TIP ADAPTER FOR A MEASUREMENT PROBE

(75) Inventors: Marc A. Gessford, Hillsboro, OR (US); Mark W. Nightingale, Washougal, WA (US); Gary W. Reed, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 54 days.

This patent is subject to a terminal disclaimer.

(21) Appl. No.: 09/668,750

(22) Filed: Sep. 22, 2000

Related U.S. Application Data

(60) Provisional application No. 60/226,772, filed on Aug. 21, 2000.

(51) Int. Cl.⁷ ............................................... G01R 31/02
(52) U.S. Cl. ....................... 324/72.5; 324/754; 324/757
(58) Field of Search ................................ 324/754, 755, 324/758, 761, 149, 437, 445, 446, 690, 696, 715, 724, 751, 757; 702/168; 439/850, 697, 692, 638, 482

(56) References Cited

U.S. PATENT DOCUMENTS

| | | | | |
|---|---|---|---|---|
| 4,321,532 A | * | 3/1982 | Luna | .......................... 324/761 |
| 4,783,624 A | * | 11/1988 | Sabin | .......................... 324/758 |
| D354,923 S | | 1/1995 | Nightingale | |
| 5,387,872 A | | 2/1995 | Nightingale | |
| 6,191,594 B1 | * | 2/2001 | Nightingale et al. | ......... 324/754 |
| 6,400,167 B1 | * | 6/2002 | Gessford et al. | ............ 324/754 |

OTHER PUBLICATIONS

Chomerics Manufacturer, division of Parker Hannifin, Woburn, Massachusetts. Catalog page "Cho–Form Robotically Dispensed Conductive Elastomer Technology", Nov. 1999.

* cited by examiner

*Primary Examiner*—Kamand Cuneo
*Assistant Examiner*—Trung Q. Nguyen
(74) *Attorney, Agent, or Firm*—William K. Bucher

(57) ABSTRACT

A probe tip adapter for a measurement probe has at least a first electrically conductive element with a bore at one end and a probing contact formed on the other end. The bore of the electrically conductive element has an electrically conductive elastomer disposed therein having sufficient tensile strength, compression set, hardness, deflection force, elongation and percent recovery for repeatably securing the electrically conductive element to the probing tip of the measurement probe. The probing contact may be configured as a probing tip having a shaft that tapers at one end to a point and as a square pin adapter with a bore formed in the electrically conductive element that receives a spring contact. The probe tip adapter is useable with both single ended and differential measurement probes.

22 Claims, 5 Drawing Sheets

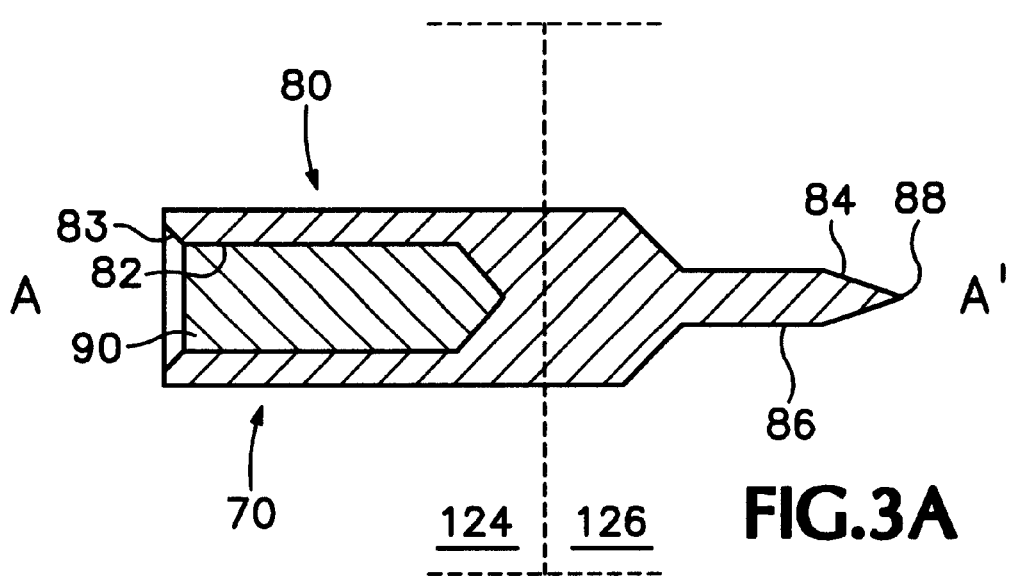
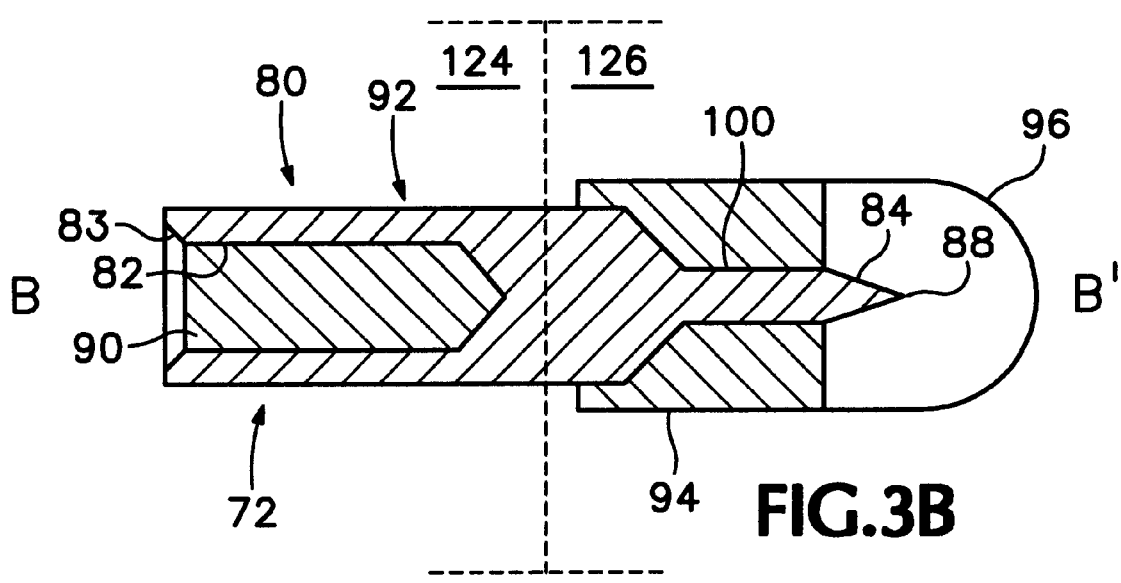

PROBE TIP ADAPTER FOR A MEASUREMENT PROBE

CROSS-REFERENCE TO RELATED APPLICATION

This application claims the benefit of the U.S. Provisional Application No. 60/226,772, filed Aug. 21, 2000.

BACKGROUND OF THE INVENTION

The present invention relates generally to probe adapters for measurement probes and more particularly to a probe tip adapter usable with very high frequency single ended and differential measurement probes.

Probe tip adapters are accessories developed for measurement probes to allow probing of various types of electrical components. The adapters allow connections to square pins mounted on a circuit board, ground points on the circuit board, leads of surface mounted integrated circuit devices, and the like. The P6243 Active Measurement Probe 10, manufactured and sold by Tektronix, Inc., Beaverton, Oreg. and assignee of the instant invention, has a socket type probe tip 12 and ground socket 14 as shown in FIG. 1 and depicted in design patent DES U.S. Pat. No. 354,923. The socket tip has an overall length of 0.255 inches and a diameter of 0.065 inches. The socket bore has a diameter of 0.038 inches and a length of 0.225 inches. Various types of probe tip adapters are inserted into the socket to allow various types of probing.

A positioning aid probe tip adapter 16, described in U.S. Pat. No. 5,387,872, has a housing 18 with a central bore 20 there through that receives a probing tip 22. The housing 18 has teeth formed in one end defining slots 24 that are positionable between the leads of an integrated circuit device. The bore 20 extends into one of these slots 24 with the probing tip 22 exposed therein. The other end of the probing tip 22 extending from the other end of the housing 18 for insertion into the socket type probe tip 12. A standard probing tip 26 has a shaft 28 that has one end tapering to a point 30 for probing IC leads, points on a circuit board and the like. The other end of the shaft is inserted into the socket type probe tip 12. The probing tip 26 may also include a cone shaped protrusion 32 formed on the shaft 28 for abutting against the socket type probe tip 12. Adapter 34 is an assembly having a flexible electrically conductive lead 36 attached to an electrical contact shaft 38 that is inserted into the socket type probe tip 12. Adapter 40 has a square pin socket 42 on one end and a contact shaft 44 on the other for inserting into the probe tip 12. The contact shafts for the above described adapters have a length in the range of 0.250 inches.

The above described probe tip adapters may also be used with differential type probes, such as the P6246 Differential Probe, manufactured and sold by Tektronix, Inc., Beaverton, Oreg., the assignee of the instant invention. When used with a differential probe, the adapters are generally ganged together for ease of use. For example, the two flexible electrically conductive lead adapters are positioned in a trapezoidal shaped housing with the flexible electrically conductive leads extending from one end of the housing and the contact shafts extending from the other end of the housing. The flexible electrically conductive leads have a pitch geometry compatible with the leads of surface mounted integrated circuit devices and the contact shafts have a pitch geometry compatible with the socket type probe tips of the measurement probe. Such a probe tip adapter is described in co-pending patent application Ser. No. 08/1738,861, filed Oct. 26, 1996 and assigned to the assignee of the instant invention. Standard probing tips are ganged together with an insulating material, such as plastic, with the contact shaft end having a pitch geometry compatible with the probing tips and the respective probing tip shafts having bends in them to allow the probing tips to match various pitch geometries of surface mounted integrated circuit devices. The bent shaft probing tips may also be rotatable within the insulating material to allow the pitch geometry of the probing tip to be changed to match the pitch geometry of the integrated circuit device. The differential square pin adapter has a housing having contact shafts extending from one end that are compatible with the pitch geometry of the differential probe tip contacts. Extending from the other end of the housing are wires that are attached to the square pin adapters.

Probe tip capacitance and inductance are major drawback to using socket type probe tip or tips in measurement probes. Tip capacitance and inductance limits the input bandwidth of the probe. With the electronic industry continuing to develop integrated and hybrid circuits operating at higher and higher frequencies, a new type of measurement probe design is required that has substantially reduced probe tip capacitance and inductance. This requires reducing the probe tip length and diameter. Likewise, probe tip adapters are required for these low capacitance probes that have reduced length and diameter.

What is needed is a probe tip adapter that is compatible with a low capacitance measurement probe. The adapter should be adaptable to various types of configurations while minimizing as much as possible additional probe tip capacitance and inductance by reducing the length and diameter of the adapters. The adapter should also be attachable to the low capacitance probe tip of the measurement probe over repeated cycles without losing physical or electrical connectivity.

SUMMARY OF THE INVENTION

Accordingly, the present invention is to a probe tip adapter for a measurement probe wherein the probe has at least a first probing tip extending from the measurement probe. The probe tip adapter has at least a first electrically conductive element with a bore at one end and a probing contact formed on the other end. Disposed in the bore of the electrically conductive element is an electrically conductive elastomer having sufficient tensile strength, compression set, hardness, deflection force, elongation and percent recovery for repeatably securing the electrically conductive element to the probing tip of the measurement probe. The probing contact may be configured as a probing tip having a shaft that tapers at one end to a point or as a bore formed in the electrically conductive element that receives a spring contact compatible with 0.025 inch square pins. Different configurations of the probing contact are envisioned with one configuration having the shaft of the probing tip being angled. The electrically conductive element is preferably machined as a single part. Alternatively, the electrically conductive element may be formed of a first electrically conductive member associated with the bore end of the element and a second electrically conductive member associated with the probing contact end of the element with the first and second members being joined together.

The probe tip adapter is usable with both a single ended measurement probe and a differential measurement probe. When used with a differential probe, the angled probe tips of the electrically conductive elements are laterally movable from at least a first position having a first pitch geometry to a second position having a second pitch geometry.

The objects, advantages and novel features of the present invention are apparent from the following detailed description when read in conjunction with appended claims and attached drawings.

BRIEF DESCRIPTION OF THE DRAWINGS

FIGS. 3A–3D are side sectional views along sectional lines A–A', B–B', C–C' and D–D' in FIG. 2 of representative probe tip adapters according to the present invention.

DETAILED DESCRIPTION OF THE PREFERRED EMBODIMENT

Figure 1:
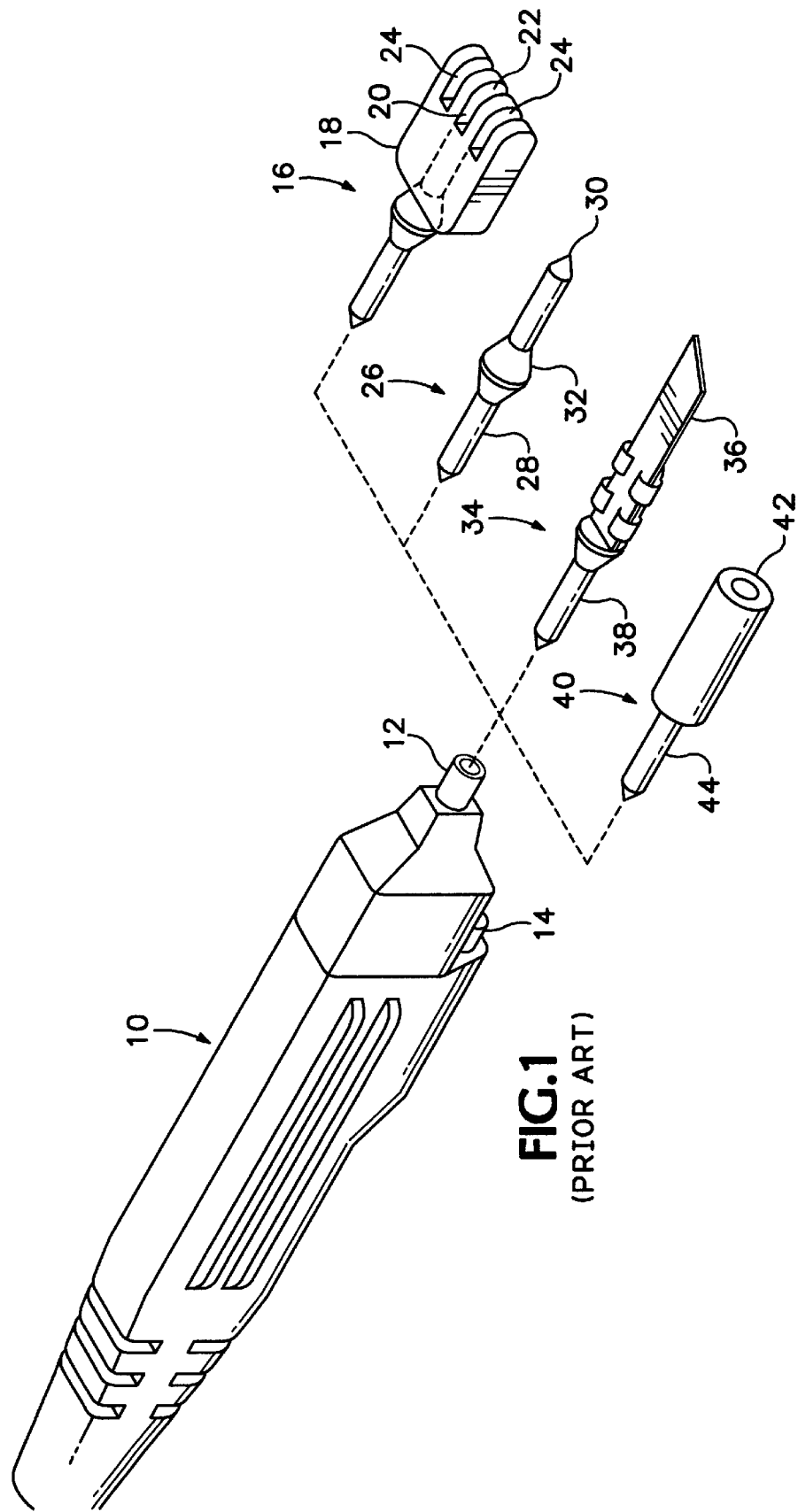
FIG. 1 is a prior art measurement probe having a socket type probe tip and associated probe tip adapters.
Figure 2:
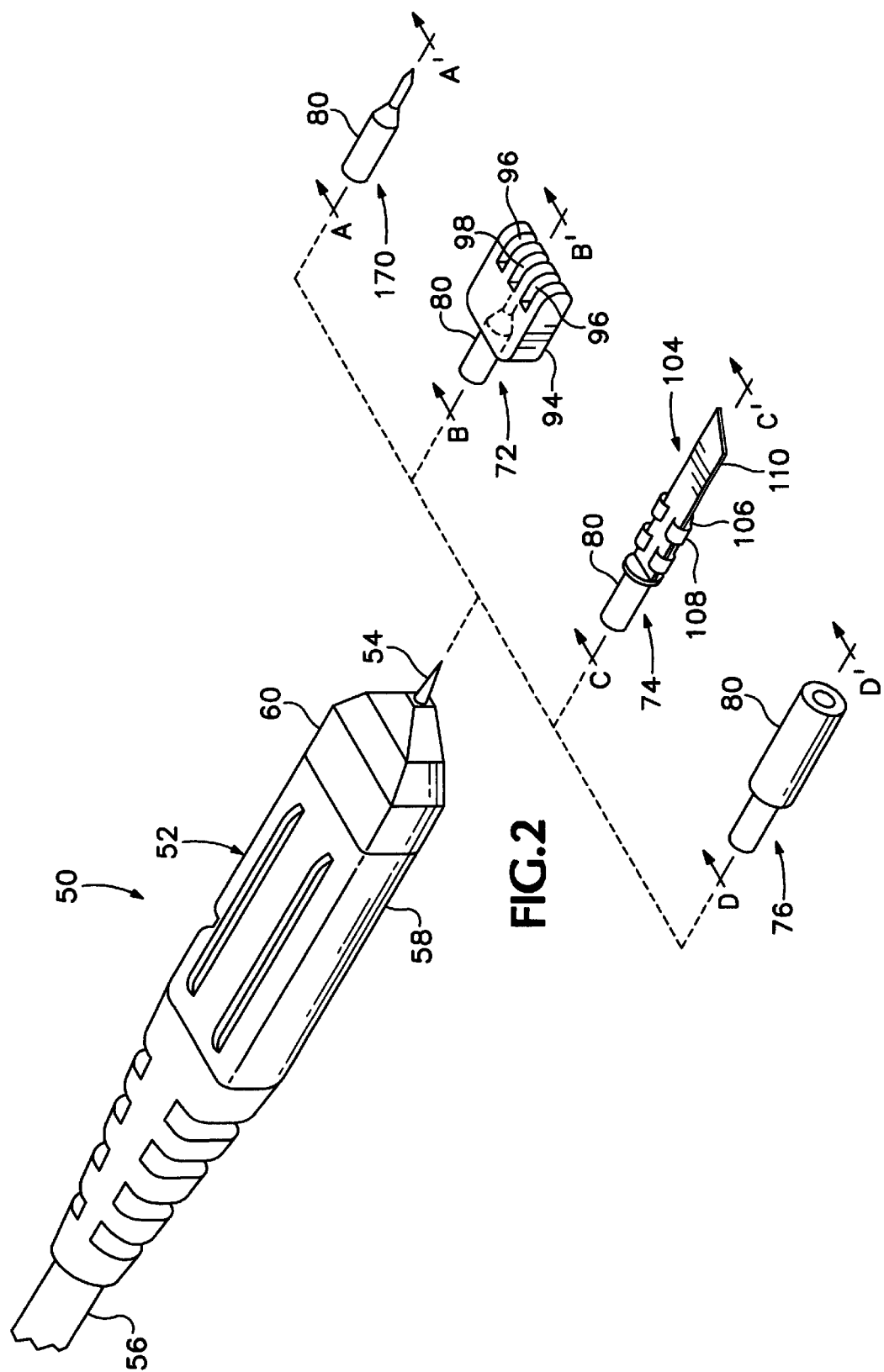
FIG. 2 is a perspective view of a measurement probe usable with the probe tip adapters according to the present invention.

Referring to FIG. 2, there is shown a perspective view of a wide bandwidth, high frequency measurement probe 50 designed for probing high bandwidth circuits. The measurement probe 50 has a probe head 52 with a probing tip 54 extending from one end thereof. A coaxial cable 56 extends from the other end to connect the probe head 52 to a measurement instrument, such as an oscilloscope, spectrum analyzer, logic analyzer and the like. The probe head 52 has an electrically conductive tubular housing 58 in which is contained a substrate. Active and passive components are mounted on the substrate to form probe input circuitry. The probing tip 54 and the coaxial cable 56 are electrically connected to the substrate. Insulating material surrounds the tubular housing 58 and a portion of the coaxial cable 56.

To achieve a wide bandwidth and gigahertz frequency range, the probe tip capacitance and inductance needs to be kept to a minimum. To accomplish this, the length and diameter of the probing tip 54 is minimized to the extent possible. Further, the substrate extends out past the end of the tubular housing 58 to minimize the stray capacitance between the substrate and the tubular housing at the probe input. A probe tip holder 60 is connected to the end of the tubular housing and has a cavity that receives the substrate. A bore is formed in the holder 60 to receive the probing tip 54 such that one end of the probing tip extends from the holder 60 and the other end contacts the substrate. The bore has a diameter in the range of 0.019 inches and a length in the range of 0.060 inches. The probing tip has a diameter of approximately 0.018 inches and an overall length in the range of 0.204 inches with the probing tip extending from the end of the holder 60 in the range of 0.107 inches. The measurement probe head 52 and the probe tip holder 60 are described in co-pending patent application Ser. No. 09/607,574, filed Jun. 29, 2000 and assigned to the assignee of the instant invention.

The probe tip adapter of the present invention may be configured with any number of probing contacts as representatively shown by probe tip adapters 70, 72, 74 and 76. Referring to probe point probe tip adapter 70 as an example and to the side sectional view of FIG. 3A, the adapter 70 has an electrically conductive element 80 having a bore 82 formed in one end and a probing contact 84 formed on the other end. Preferably, a bevel 83 is formed at the bore opening to aid in placement of the adapter 80 onto the probing tip 54. In the specific example, the probing contact 84 has a shaft 86 that tapers to a point 88. The electrically conductive element 80 has an overall length of approximately 0.235 inches. The outside diameter of the bore end of the electrically conductive element 80 is approximately 0.060 inches and the diameter of the bore 82 is approximately 0.040 inches. The bore 82 has an approximate depth of 0.115 inches. The probe contact shaft 86 has a diameter of approximately 0.018 inches and an overall length to the tip of approximately 0.100 inches.

Disposed in the bore 82 is an electrically conductive elastomer 90 that secures the probe point probe tip adapter 70 to the probing tip 54 of the measurement probe 50. The electrically conductive elastomer 90 has specific properties, such as tensile strength, compression set, hardness, deflection force, elongation, percent recovery and the like that allow the probe tip adapter to be repeatably secured to the probe Up 54. Preferably the elastomer 90 has a tensile strength in the range of 300 PSI or 2.07 Mpa., a maximum compression set of 25%, a Shore A hardness in the range of 45, a 25% deflection force in the range of 4 lb/in or 0.71 kg/cm and a 50% deflection force in the range of 12 lb/in or 2.14 kg/cm, and elongation in the range of 250%. The compression set is expressed as a percentage of deflection at 25% deflection. Percent recovery is determined from the compression set as one-fourth of the compression set value subtracted from 100%. For a compression set of 25% the recovery percent is 93.75%. A silver-copper conductive filler is preferably used in the elastomer having a volume resistivity in the range of 0.008 ohm/cm. An example of an electrically conductive elastomer that meets the above described properties is Cho-Form 2.1, manufactured and sold by Chomerics, a Division of Parker Hannifin, Woburn, Mass. Other types of electrically conductive elastomers having similar properties may be used without departing from the scope of the present invention.

FIG. 3B shows a side sectional view along sectional line B–B' in FIG. 2 of a positioning aid probe tip adapter 72. The electrical conductive element 80 of the positioning aid probe tip adapter 72 includes the basic structural elements of the probe point probe tip adapter 70. The electrically conductive element 80 has a beveled bore 82 at one end and a tapered probing contact 84 formed on the other end. The bore 82 is filled with the electrically conductive elastomer 90 as previously described. A nonconductive housing 94 has teeth 96 formed in one end thereof defining slots 98 (as shown in FIG. 2) with the teeth 96 being positionable between the leads of an integrated circuit device. A bore 100 is formed in the housing that extends from one of the slots 98 to the opposite end of the housing 94. The tapered probing contact 84 of the electrically conductive element 80 is positioned in the bore 100 with probing tip 88 extending into the slot 98. The bore end of the electrically conductive element 80 extends outward from the housing 94 for positioning on the probe tip 54.

Figure 3C:
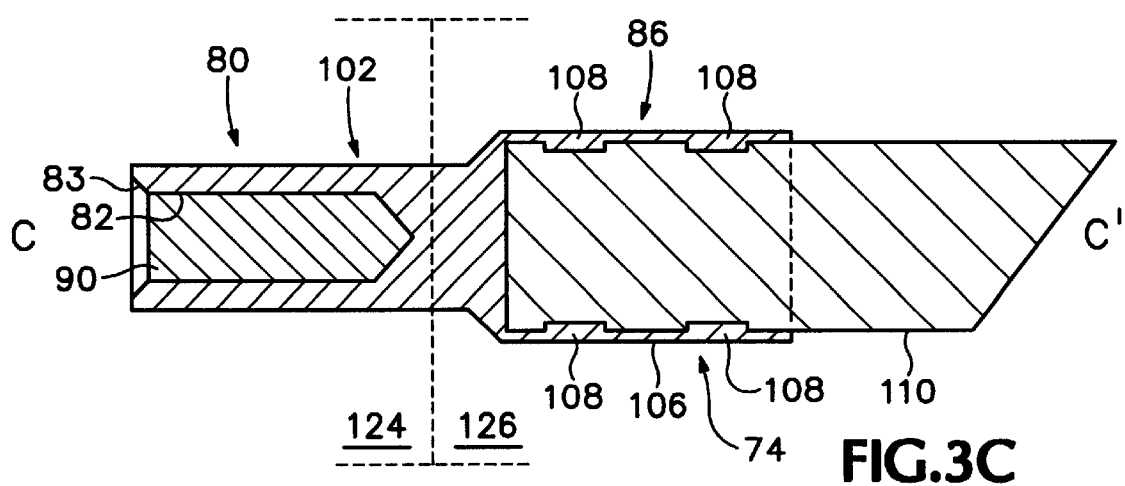

FIG. 3C shows a side sectional view along sectional line C–C' in FIG. 2 of a flexible lead probe tip adapter 74. The flexible lead probe tip adapter 74 has an electrical conductive element 80 with a structurally similar beveled bore 82 at one end. The bore 82 is filled with the electrically conductive elastomer 90 as previously described. A portion of the probing contact 84 of the electrically conductive element 80 is modified to have a flat portion 106 with tapered fingers 108 extending upward from the flat portion 106. A flexible electrically conductive lead 110 is positioned on the flat portion 106 with the tapered fingers 108 being crimped onto the flexible electrically conductive lead 110 to secure the lead to the flat portion 106.

Figure 3D:
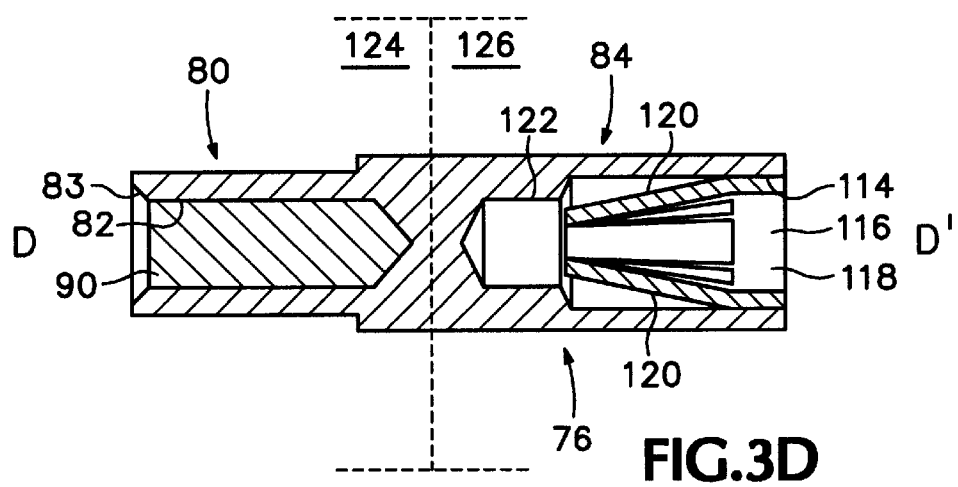

FIG. 3D shows a side sectional view along sectional line D–D' in FIG. 2 of a square pin probe tip adapter 76. The square pin probe tip adapter 76 has an electrical conductive element 80 with a structurally similar beveled bore 82 at one end. The bore 82 is filled with the electrically conductive elastomer 90 as previously described. The probe contact end 84 has a bore 114 formed therein having a diameter that receives a spring contact 116. The spring contact 116 may be formed with a circular ring 118 and inwardly disposed flexible finger 120 extending from the ring 118. A second bore 122 having a diameter smaller than the first bore is formed adjacent to the first bore and is sized to receive a square pin. In the preferred embodiment, the bores 114 and 122 and the spring contact 116 are dimensioned to receive a 0.025 inch square pin. The electrically conductive element 80 has an overall length of approximately 0.270 inches. The contact end of the element 80 has an approximate diameter of 0.072 inches and the bore 114 has a diameter of approximately 0.051 inches and a depth of approximately 0.089 inches. The bore 122 has a diameter of approximately 0.037 inches and an approximate length of 0.046 inches for a combined overall length of the two bores of approximately 0.135 inches. An example of such a spring contact is manufactured by Mill-Max, Inc., Oyster Bay, N.Y., under part number contact #47. The bores 114 and 122 and the spring contact 116 are not limited to dimensions for a 0.025 square pin and other bore and spring contact dimensions may be used for different sized spring contacts with departing from the scope of the invention.

The electrically conductive element 80 is preferably machined from an electrically conductive blank made of brass, beryllium copper or similar type electrically conductive material. The bore 82 is machined into one end of the blank. The other end of the blank is machined to form the probing contact end of the electrically conductive element 80. The blank is turned on a lathe or similar type machinery, such as a grinder, to form the probing contact for the probe point probe tip adapter 70. For the flexible electrically conductive lead probe tip adapter 74, the probe contact end of the blank is stamped to form the flat portion and the tapered fingers. For the square pin probe tip adapter 76, the blank is turned on a lathe or similar type of machinery to remove material at the bore end of the blank. The probe contact end is bored to receive the spring contact. The prepared electrically conductive element blank for each probe tip adapter configuration is heat treated and gold plated over a plated layer of sulfamate nickel. Alternatively, the electrically conductive element 80 may be formed of first and second electrically conductive members 124 and 126 as shown in the side sectional view drawings. The first electrically conductive member 124 is associated with the bore 82 end of the electrically conductive element 80 and the second conductive member 126 is associated with the probe contact end 84 of the electrically conductive element 80. The electrically conductive members 124 and 126 are heat treated and plated as previously described and joined together using well known joining techniques, such as brazing, gluing with an electrically conductive adhesive or the like, to produce the various probe tip adapters. Depending on the type of material used for the blanks, heat treating may not be necessary. For example, the square pin probe tip adapter blank may be formed of brass, which has sufficient hardness and does not benefit from heat treating. On the other hand, the probe point probe tip adapter blank is formed of beryllium copper requiring heat treating to increase the hardness.

Figure 4:
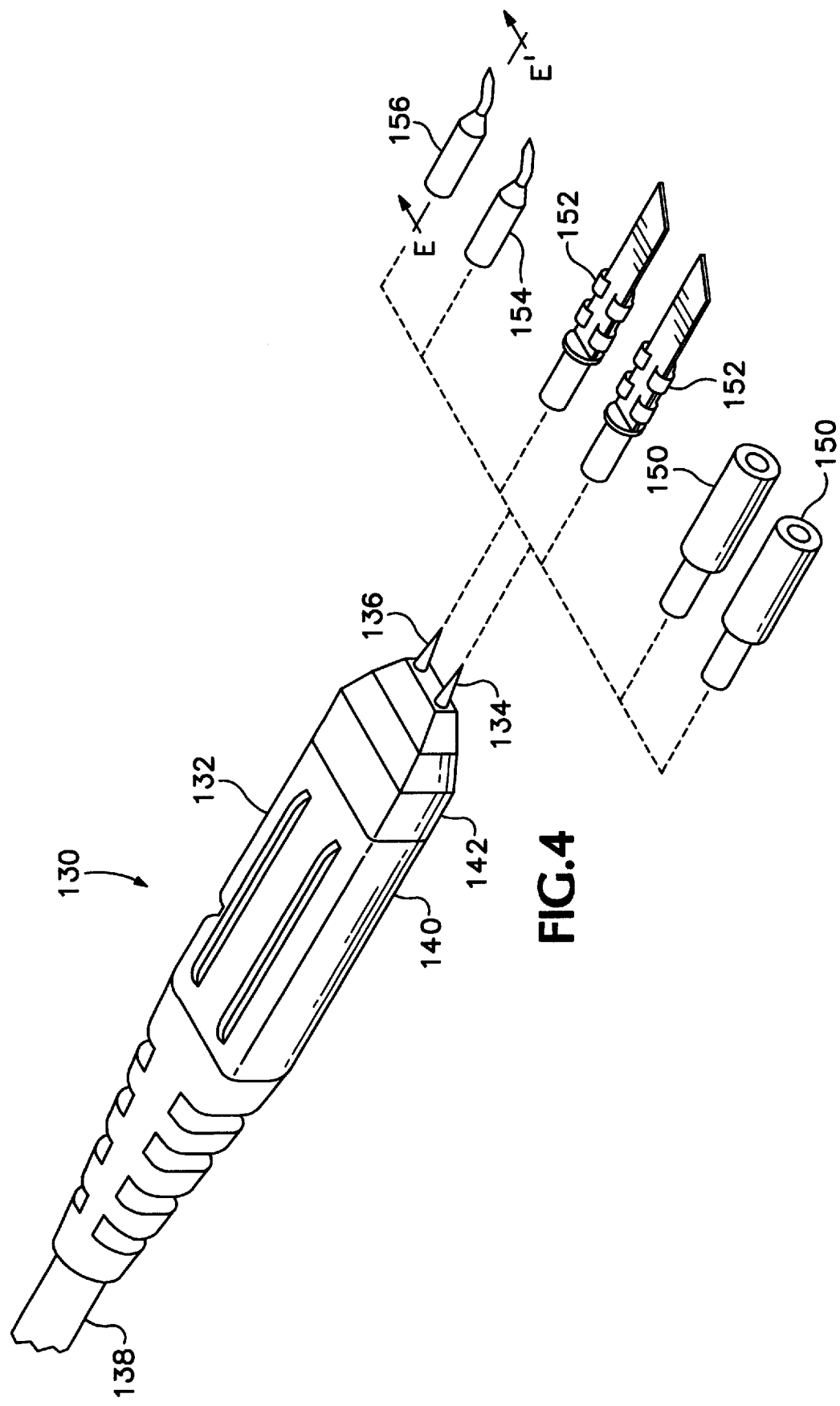
FIG. 4 is a perspective view of a differential probe usable with the probe tip adapters according to the present invention

Referring to FIG. 4, there is shown a perspective view of a wide bandwidth, high frequency differential measurement probe 130 having similar design features to the measurement probe of FIG. 2. The differential measurement probe 130 has a probe head 132 with first and second probing tips 134 and 136 extending from one end thereof. A coaxial cable 138 extends from the other end to connect the probe head to a measurement instrument, such as an oscilloscope, spectrum analyzer, logic analyzer and the like. The probe head 132 has an electrically conductive tubular housing 140 in which is contained a substrate. Active and passive components are mounted on the substrate to form probe input circuitry. The probing tips 134 and 136 and the coaxial cable 138 are electrically connected to the substrate. Insulating material surrounds the tubular housing 140 and a portion of the coaxial cable 138. A probe tip holder 142 is connected to the end of the tubular housing and has a cavity that receives the substrate. First and second bores are formed in the holder to receive the probing tips 134 and 136 such that ends of the probing tips extends from the housing and the other ends contact the substrate. The bores have a diameter in the range of 0.019 inches and a length in the range of 0.060 inches as previously described with a center to center spacing between the bores of 0.100 inches. The probing tips have the same overall diameter and length as the probing tip previously described and extend from the end of the holder the same distance as previously described.

Figure 5:
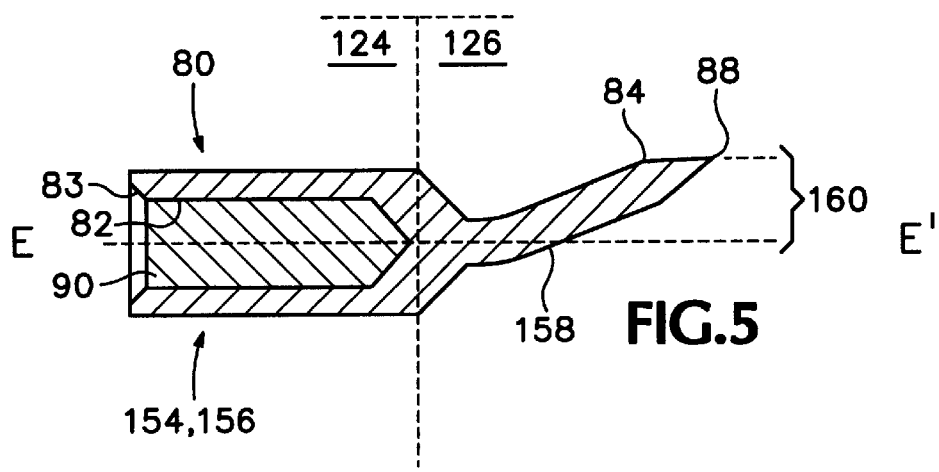
FIG. 5 is a side sectional view along sectional line E–E' in FIG. 4 of angled probing tip in the probe tip adapter according to the present invention.

The square pin and flexible electrically conductive lead probe tip adapters 150 and 152 are of the same design as previously described. The probe point probe tip adapter 70 of FIG. 2 has been modified to an angled probe point probe tip adapter 154, shown in more detail in the cross sectional view along sectional line E–E' of FIG. 5. The angled probe point probe tip adapters 154 and 156 each have an electrically conductive element 80 with a bore 82 formed in one end. Electrically conductive elastomer 90, such as previously described is disposed in the bore 82. The probe contact end 84 of the electrically conductive element 80 has an angled shaft 158 extending from the bore end of the electrically conductive element 80. In the preferred embodiment, the deflection distance of the probing tip 88 from the center line of the element is approximately 0.040 inches as represented by dimension length 160. The deflection distance of the angled probe point probe tip adapters 154 and 156 allows the probe tips 88 to laterally rotate about the probing tips 134 and 136 to establish various pitch geometries between the probe tips 88 for probing points or devices with differing lead pitch geometries.

A probe tip adapter for a measurement probe has been described having an electrically conductive element with a bore at one end and a probing contact formed on the other end. An electrically conductive elastomer is disposed in the bore of the electrically conductive element that has sufficient tensile strength, compression set, hardness, deflection force, elongation and percent recovery for repeatably securing the electrically conductive element to the probing tip of the measurement probe. The probing contact may be configured as a probing tip having a shaft that tapers at one end to a point or as a bore formed in the electrically conductive element that receives a spring contact compatible with 0.025 inch square pins. Different configurations of the probing contact are envisioned with one configuration having the shaft of the probing tip being angled. The electrically conductive element is preferably machined as a single part. Alternatively, the electrically conductive element may be formed of a first electrically conductive member associated with the bore end of the element and a second electrically conductive member associated with the probing contact end of the element with the first and second members being joined together. The probe tip adapter is usable with both single ended and differential measurement probes.

It will be obvious to those having skill in the art that many changes may be made to the details of the above-described embodiments of this invention without departing from the underlying principles thereof. The scope of the present invention should, therefore, be determined only by the following claims.

What is claimed is:

1. A probe tip adapter for a measurement probe wherein the probe has at least a first probing tip extending from the measurement probe comprising:

at least a first electrically conductive element having a bore at one end and a probing contact formed on the other end; and an electrically conductive elastomer disposed in the bore of the electrically conductive element having sufficient tensile strength, compression set, hardness, deflection force, elongation and percent recovery for repeatably securing the electrically conductive element to the probing tip of the measurement probe.

2. The probe tip adapter as recited in claim 1 wherein the probing contact comprises a probing tip having a shaft that tapers at one end to a point.

3. The probe tip adapter as recited in claim 2 wherein the shaft of the probing tip is angled.

4. The probe tip adapter as recited in claim 1 wherein the probing contact comprises a bore formed in the electrically conductive element that receives a spring contact.

5. The probe tip adapter as recited in claim 4 wherein the probing contact bore and the spring contact are dimensioned to receive a 0.025 inch square pin.

6. The probe tip adapter as recited in claim 1 wherein the electrically conductive element further comprises a first electrically conductive member associated with the bore end of the element and a second electrically conductive member associated with the probing contact end of the element with the first and second members being joined together.

7. The probe tip adapter as recited in claim 6 wherein the second member further comprises a probing tip having a shaft that tapers at one end to a point.

8. The probe tip adapter as recited in claim 7 wherein the shaft of the probing tip is angled.

9. The probe tip adapter as recited in claim 6 wherein the second member has a bore formed therein that receives a spring contact.

10. The probe tip adapter as recited in claim 9 wherein the second member bore and the spring contact are dimensioned to receive a 0.025 inch square pin.

11. The probe tip adapter as recited in claim 1 wherein the measurement probe is a differential probe having first and second probing tips extending from the measurement probe and the probe tip adapter further comprising a second electrically conductive element having electrically conductive elastomer disposed in the bore.

12. The probe tip adapter as recited in claim 11 wherein each of the probing contacts of the electrically conductive elements comprises a probing tip having a shaft that tapers at one end to a point.

13. The probe tip adapter as recited in claim 12 wherein the shaft of the probing tip is angled.

14. The probe tip adapter as recited in claim 13 wherein the angled probe tips of the first and second electrically conductive elements are laterally movable from at least a first position having a first pitch geometry to a second position having a second pitch geometry.

15. The probe tip adapter as recited in claim 11 wherein each of the probing contacts of the electrically conductive elements has a bore formed therein that receives a spring contact.

16. The probe tip adapter as recited in claim 15 wherein the probing contact bore and the spring contact are dimensioned to receive 0.025 inch square pins.

17. The probe tip adapter as recited in claim 11 wherein each of the electrically conductive elements further comprise a first electrically conductive member associated with the bore end of the element and a second electrically conductive member associated with the probing contact end of the element with the first and second members being joined together.

18. The probe tip adapter as recited in claim 17 wherein the second member further comprises a probing tip having a shaft that tapers at one end to a point.

19. The probe tip adapter as recited in claim 18 wherein the shaft of the probing tip is angled.

20. The probe tip adapter as recited in claim 19 wherein the angled probe tips of the first and second electrically conductive elements are laterally movable from at least a first position having a first pitch geometry to a second position having a second pitch geometry.

21. The probe tip adapter as recited in claim 17 wherein the second member has a bore formed therein that receives a spring contact.

22. The probe tip adapter as recited in claim 21 wherein the second member bore and the spring contact are dimensioned to receive a 0.025 inch square pin.

* * * * *